United States Patent [19]

Dickinson et al.

[11] Patent Number: 5,355,345
[45] Date of Patent: Oct. 11, 1994

[54] FULLY SCALABLE MEMORY APPARATUS

[75] Inventors: Alexander G. Dickinson, Neptune, N.J.; Christopher J. Nicol, Springwood, Australia

[73] Assignee: AT&T Bell Laboratories, Murray Hill, N.J.

[21] Appl. No.: 132,068

[22] Filed: Oct. 4, 1993

[51] Int. Cl.$^5$ ............................................. G11C 13/00
[52] U.S. Cl. ........................ 365/230.01; 365/230.03; 365/230.08; 365/200
[58] Field of Search ................... 365/230.01, 230.03, 365/230.04, 230.05, 230.08, 200

[56] References Cited

U.S. PATENT DOCUMENTS 5,199,033  3/1993  McGeoch et al. ................. 365/200

OTHER PUBLICATIONS

T. Hirose, H. Kuriyama, S. Murakami, K. Yuzuriha, T. Mukai, K. Tsutsumi, Y. Nishimura, Y. Kohn, K. Anami, "A 20-ns 4-Mb CMOS SRAM with Hierachical Word Decoding Architecture", IEEE Journal of Solid-State Circuits, vol. 25, No. 5, Oct., 1990.
S. Aizaki, T. Shimizu, M. Ohkawa, K. Abe, A. Aizaki, M. Ando, O. Kudoh, I. Sasaki, "A 15ns 4-Mb CMOS SRAM", IEEE Journal of Solid-State Circuits, vol. 25, No. 5, Oct., 1990.
T. I. Chappel, B. A. Chappel, S. E. Schuster, J. W. Allan, S. P. Klepner, R. V. Joshi, R. L. Franch, "A 2-ns Cycle, 3.8-ns Access 512-kb CMOS ECL SRAM with a Fully Pipelined Architecture", IEEE Journal of Solid-State Circuits, vol. 26, No. 11, Nov., 1991.
D. Schmitt-Landsiecel, B. Hoppe, G. Neuendorf, W. Wurm, J. Winnerl, "Pipeline Architecture for Fast CMOS Buffer RAM's", IEEE Journal of Solid-State Circuits, vol. 25, No. 3, Jun., 1990.
J. Yuan, C. Svensson, "High-Speed CMOS Circuit Technique", IEEE Journal of Solid-State Circuits, vol. 24, No. 1, Feb., 1989.
D. W. Dobberpuhl e4t al., "A 200Mhz 64-b Dual-Issue CMOS Microprocessor", IEEE Journal of Solid-State Circuits, vol. 27, No. 11, Nov., 1992.

*Primary Examiner*—Terrell W. Fears
*Attorney, Agent, or Firm*—Eugene S. Indyk

[57] ABSTRACT

A memory is partitioned into rows and columns of memory blocks comprised of latches, sense amplifiers, and logic circuitry that form independent pipelines through which flow a) input addresses for memory access requests and b) data to be written into a specific memory cell within a memory block. The memory allows multiple data access requests in consecutive clock cycles to be pipelined in the rows and columns of memory blocks such that the memory clock speed is equal to the clock speed of a single memory block, independently of the memory size.

10 Claims, 4 Drawing Sheets

FULLY SCALABLE MEMORY APPARATUS

TECHNICAL FIELD

This invention relates to memories. More specifically, this invention relates to fully scalable memories.

BACKGROUND

Traditionally, VLSI memories have been designed to allow quick access to, and modification of, data stored in the memories, within a single memory cycle. A corollary of that design strategy is to set a lower bound on memory cycle time for a given memory size within the limitations of a particular technology (CMOS, GaAs). A consequence of that design strategy is that increases in memory size result in a proportional increase in cycle time caused by an increased capacitance of bit lines and word lines. Thus, memory designers had to balance the benefits of greater memory size against the disadvantages of slower access time.

Efforts to increase memory size without increasing access time have led memory designers to partition a memory into small modules called "blocks" that allow shorter word lines and bit lines per block, thereby improving both access time and memory throughput. In these new designs, communication to and from the blocks of memory are established via a bus that is used to broadcast input addresses and data to all blocks, and to transmit data retrieved from a selected block to the chip output pins. Although these techniques have resulted in faster and higher throughput, the size of memories using these techniques is limited. Specifically, a point of diminishing return is reached when propagation delay through the bus (whose length increases with an increasing number of blocks) and other interconnect delays outweigh the reduced time required to access a block.

SUMMARY

This invention is directed to memories which allow multiple data access requests in consecutive clock cycles to be pipelined in a two dimensional array of address and data distribution so that a constant memory access frequency can be achieved independently of memory size.

In a specific example of the invention, a memory is divided into blocks arranged in an array of N rows and M columns of blocks. Latches, sense amplifiers, and other logic circuitry associated with the blocks of the array allow creation of two independent pipelines through which flow systolically a) input addresses for memory access requests and b) data to be written into a specific memory cell within a block for write operations.

In accordance with the invention, data stored in a specific memory cell within a block is retrieved or modified using an addressing scheme in which input addresses are decoded into specific signals representing block column, block row, memory cell column, and memory cell row. These signals are clocked perpendicularly as they they are propagated (one block per cycle) through independent data paths within the blocks of the array. When the independent paths of the row and column address components intersect at the desired memory block, indicated by the row and column block addresses, a memory cell operation is performed at the specific cell within the block indicated by the row and column components of the cell address. For data retrieval (read) operation, the retrieved data is then propagated to the memory chip output pins.

For a write operation, the aforementioned addressing and propagation schemes are also used. However, the input data to be written follows preferably the path of the input address column component. When the paths of the row component address and the column component address intersect at the desired block, the input data is written at the desired cell indicated by the row and column cell addresses.

A feature of one example of the invention is to set up in different pipelining stages a) the aforementioned address decoding scheme b) the fully random memory cell access mechanism, and c) the data retrieval and modification plan for multiple data access or update requests in consecutive clock cycles.

Another feature of one example of the invention is to provide robustness and fault tolerance for large, monolithic memories through the use of a content addressable memory (CAM) which stores addresses of defective pans (rows, columns or cells) in the memory and maps them to addresses of operative pans of the memory.

Advantageously, this invention limits the maximum length of a communication path within a memory to the size of one block of that memory. That limitation, coupled with the pipelining feature, allows the clock speed of the memory to be set by the clock speed of a single memory block, regardless of the number of blocks in the memory.

DETAILED DESCRIPTION

Figure 1:
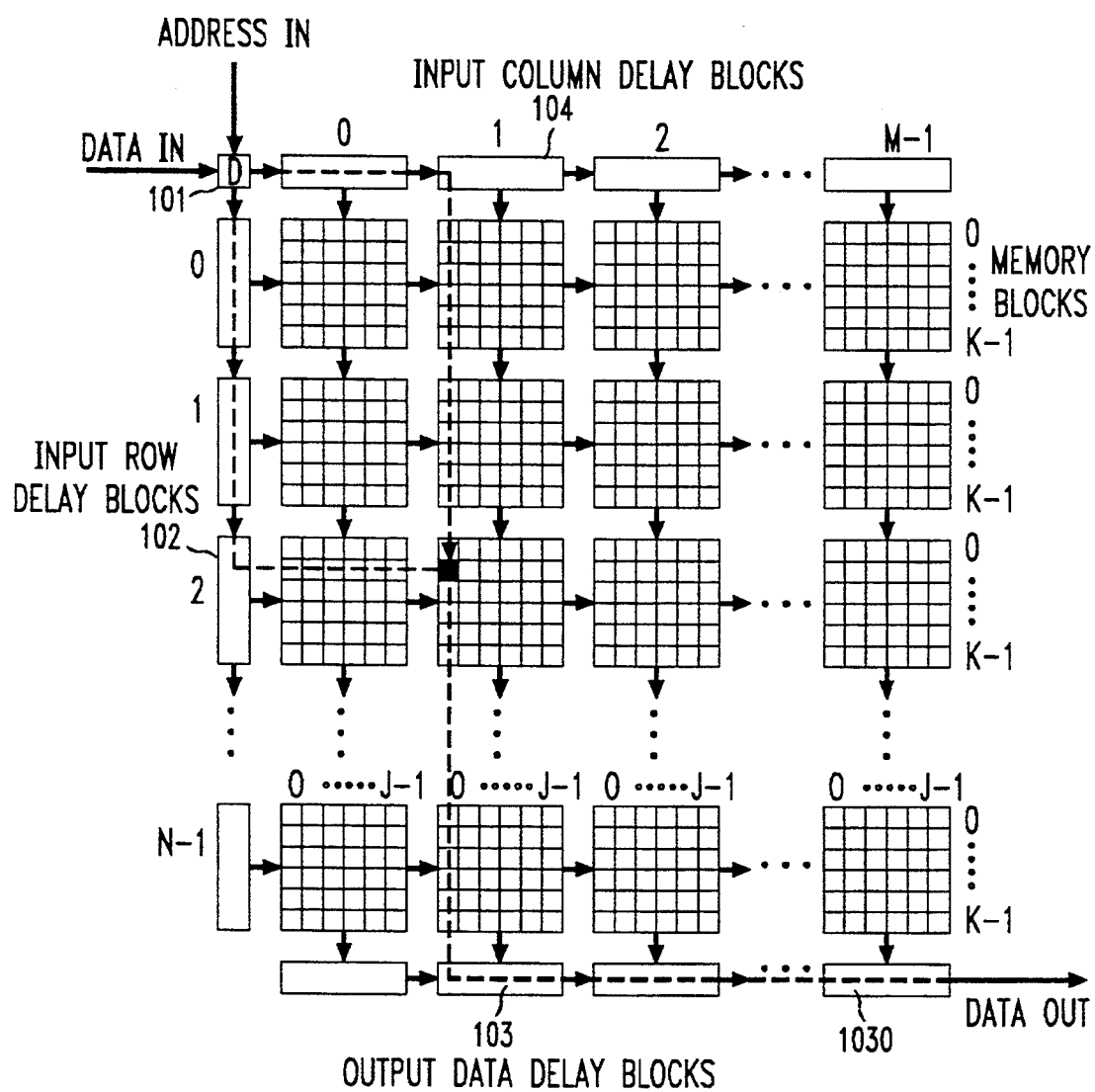
FIG. 1 is a schematic representation of one example of a memory, in accordance with the invention.

FIG. 1 is a schematic representation of a memory in accordance with the invention. The memory of FIG. 1 is partitioned into blocks of memory cells arranged in an array of N rows of blocks and M columns of blocks. Each block contains K rows of memory cells and J columns of memory cells. Thus, the memory of FIG. 1 has a total of $J \times K \times M \times N$ memory cell addresses. Accordingly, each memory cell is uniquely identified by a pair of coordinates, namely, the coordinates of the memory cell within its respective block and the coordinates of the block in which the specific cell is located. The memory cell coordinates may be denoted by $(m_r, m_c)$, where $m_r$ is the memory cell row, $m_c$ is the memory cell column, $0 \leq m_r < K$, and $0 \leq m_c < J$. Similarly, the block coordinates may be denoted by $(b_r, b_c)$ where $b_r$ is the block row, $b_c$ is the block column, $0 \leq b_r < N$, and $0 \leq b_c < M$.

The blocks of the array of FIG. 1 may be fully synchronized to a single clock and movements between blocks occur at clock edges. An H-tree clock distribution system may be used to minimize clock skew between adjacent memory blocks and also to provide fast clock edges.

Addresses and data comprise a string of bits which enter the memory of FIG. 1 through a decoder 101. The decoder 101 splits an address input into two components. One component is a row component identifying a block row $b_r$ and a memory cell row $m_r$. A second component is a column component identifying a block column $b_c$ and a memory cell column $m_c$. An address input may be decoded, for example, by considering the first w bits in the address input to be the identity of the row address of a block and the next x bits in the address input to be the identity of the column address of that block. The next y bits in the input address indicate the column address of a particular cell within that block and the last z bits of the address input identify the column address of the same cell in the block. The values of w, x, y, and z depend on the number of rows and columns of blocks in the memory and the number of bit-lines and wordlines associated with each of the blocks of the array. The entire decoding process may take place in the decoder 101 or partial decoding may take place in the decoder 101 and the rest of the decoding may take place either in a memory block or in a series of input delay blocks 102 and 104 in order to minimize their word width.

After an address input has entered decoder 101, the row component of that address $(b_r, m_r)$ travels through the input row delay blocks 102 while the column component $(b_c, m_c)$ travels through the input column delay blocks 104. The role of input delay blocks 102 and 104 is to synchronize the propagation progress of a) column addresses (and data, if appropriate) and row addresses within the array so that they arrive at the right cell within the right block within one clock cycle of each other. Examples of input delay blocks 102 and 104 include series of latches which store addresses or data.

Once an address reaches the desired memory block of the array, the block row or column address component is discarded and only the cell row or column address component is propagated through that block of the array.

The memory access aspect of the invention can be illustrated by considering a data retrieval operation, for example, for cell (0,1) within block (2,1) (indicated by the filled cell in FIG. 1). The input address of memory cell (0,1) within block (2,1) first enters the decoder 101. During a first memory cycle, the input address is decoded into row and column address components in decoder 101. The row address component is delayed two cycles before entering the memory blocks component of the array at block (0,1). Similarly, the column address is delayed three cycles before entering the memory blocks component of the array at block (2,0). The row and column address components (cell only) are propagated (vertically for the column, horizontally for the row) from one block to the next using, for example, a small voltage swing which is read by sense amplifiers (not shown and described in further detail below). After a total of six cycles, the row and column cell address components meet at block (2,1) where a read operation occurs (using well-known techniques) at cell (0,1). After data has been retrieved from cell (0,1), within block (2,1), the retrieved data is propagated vertically through the block(s) of the array (one block per cycle) until it reaches one of the blocks in an output data delay block 103. Subsequently, the retrieved data is propagated horizontally through the block(s) of output data delay block 103 (one output data delay block per cycle) until it reaches output data delay block 1030 which sends the data to a memory output. Thus, for an N×M array of blocks, the latency is approximately N+M memory cycle time periods.

For a write operation, the same addressing and data propagation schemes described above are used. The data to be written to a desired memory cell, such as cell (0,1) within block (2,1) travels, preferably vertically, through the memory blocks using the propagation scheme described above until the desired block is reached.

In order to provide a clear description of the pipelining process of the invention, a discussion of exemplary techniques which may be used to propagate data through a block without affecting the data content of the cells within that block, is warranted.

In a first one of these techniques, the existing horizontal word lines are used for horizontal communications. If the bit-lines are kept at "1" at the same time, the contents of the memory block will remain unchanged as required during the activation of the word line.

In a second one of these exemplary techniques for horizontal communication, each row of cells is equipped with a bypass conductive wire or path, which serves as a conduit for data traversing the row of cells within that block for horizontal communications. Because data traversing the row of cells pass through the wire or path, the contents of that row of cells are unaffected.

In a third of these exemplary techniques for vertical communication, data is transferred over the vertical bit-lines, and the word lines are set to zero to prevent the content of the cells from being altered as data travel through the column of cells.

Figure 2:
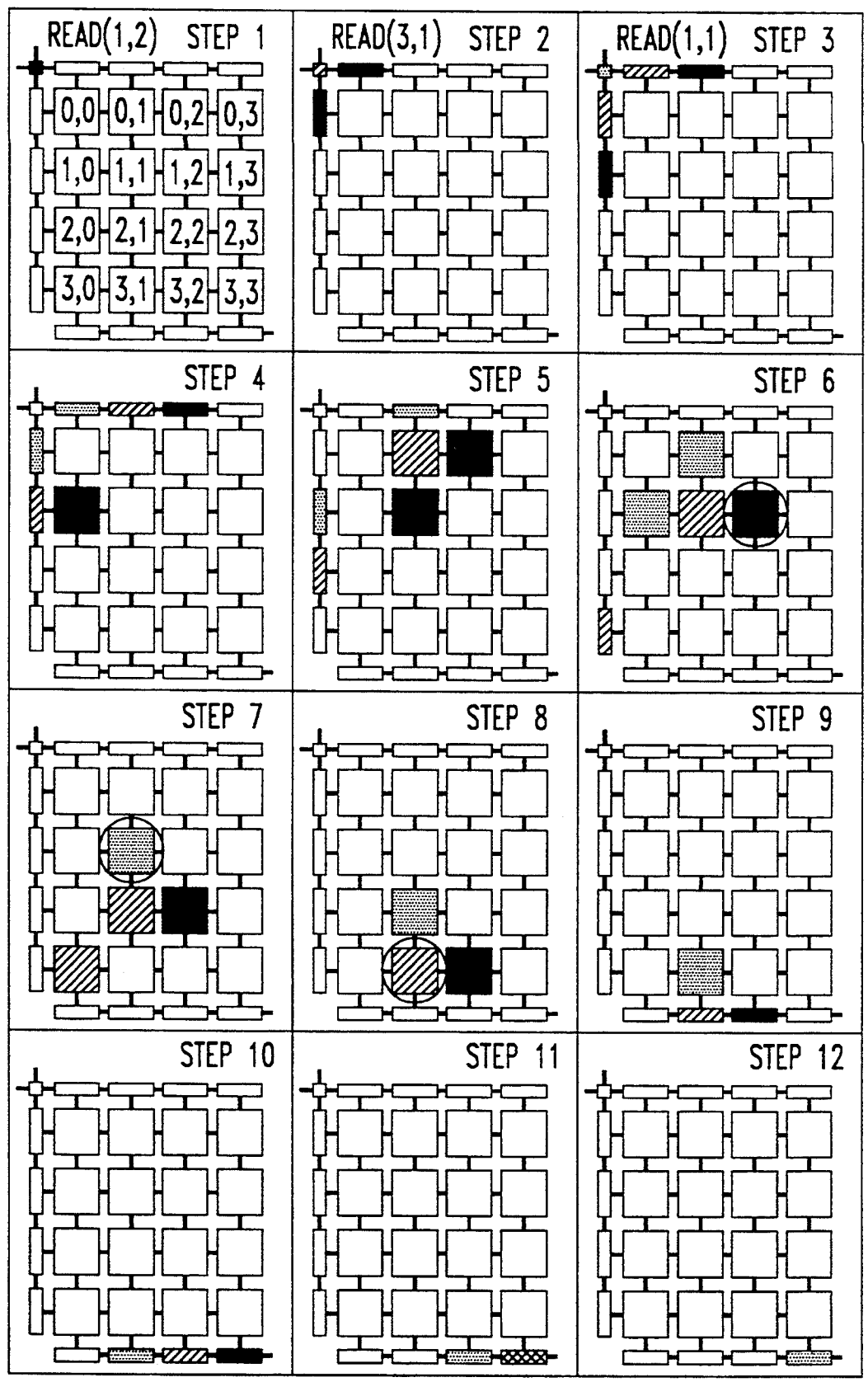
FIG. 2 illustrates multiple memory accesses pipelined into the memory of FIG. 1.

FIG. 2 illustrates multiple memory accesses pipelined into the memory of FIG. 1. In FIG. 2, three memory access requests representing three read operations are issued in three consecutive clock cycles, shown as steps 1 through 3. Each step in FIG. 2 represents a clock cycle. The diagram of FIG. 2 shows the state of the systolic array with the address and/or data for each request represented by a different shading. A circle around a memory block indicates a memory access taking place in the circled block.

In the first step, the input address for a particular cell in block (1,2) hereafter called "A1" is decoded using the decoding scheme described above. In step 2, while the row and column address components for A1 travel through the input row and column blocks, the input address for block (3,1) hereafter called "A2" is decoded. In step 3, the input address for a particular cell in block (1,1) hereafter called "A3" is decoded while A1 and A2 travel through the input delay blocks. In step 4, the cell row address component of A1 is transferred horizontally to block (1,0), while A2, A3 and the column address component of A1 continue their journey through the input delay blocks. In step 5, A1 moves horizontally one block and vertically one block. Within the same step, the A2 cell column address enters the memory blocks of the array while A2 cell row address travels through the row input delay address blocks. In that same step, A3 continues its journey through the row and column input delay address blocks. In step 6, A1 reaches its final destination when its input cell row address and its input cell column address intersect at block (1,2). At that time, the data stored in the desired memory cell is retrieved. Within that same step, A2 column address advances one more block in the input row delay block, while its cell column address moves down one block vertically in the memory blocks of the array. Simultaneously, A3 enters the memory blocks of the array horizontally and vertically. This process continues until data is retrieved from the desired cells in the respective blocks (1,2), (3,1) and (1,1).

The physical accessing of the memory cells may not occur in the same sequence as requested. For example, the read (operation) from block (1,1), which is the third request, is physically performed in step (cycle) 7, one step before the read (operation) from block (3,1). However, the output path ensures that the data emerges from the memory in the correct sequence.

Figure 3:
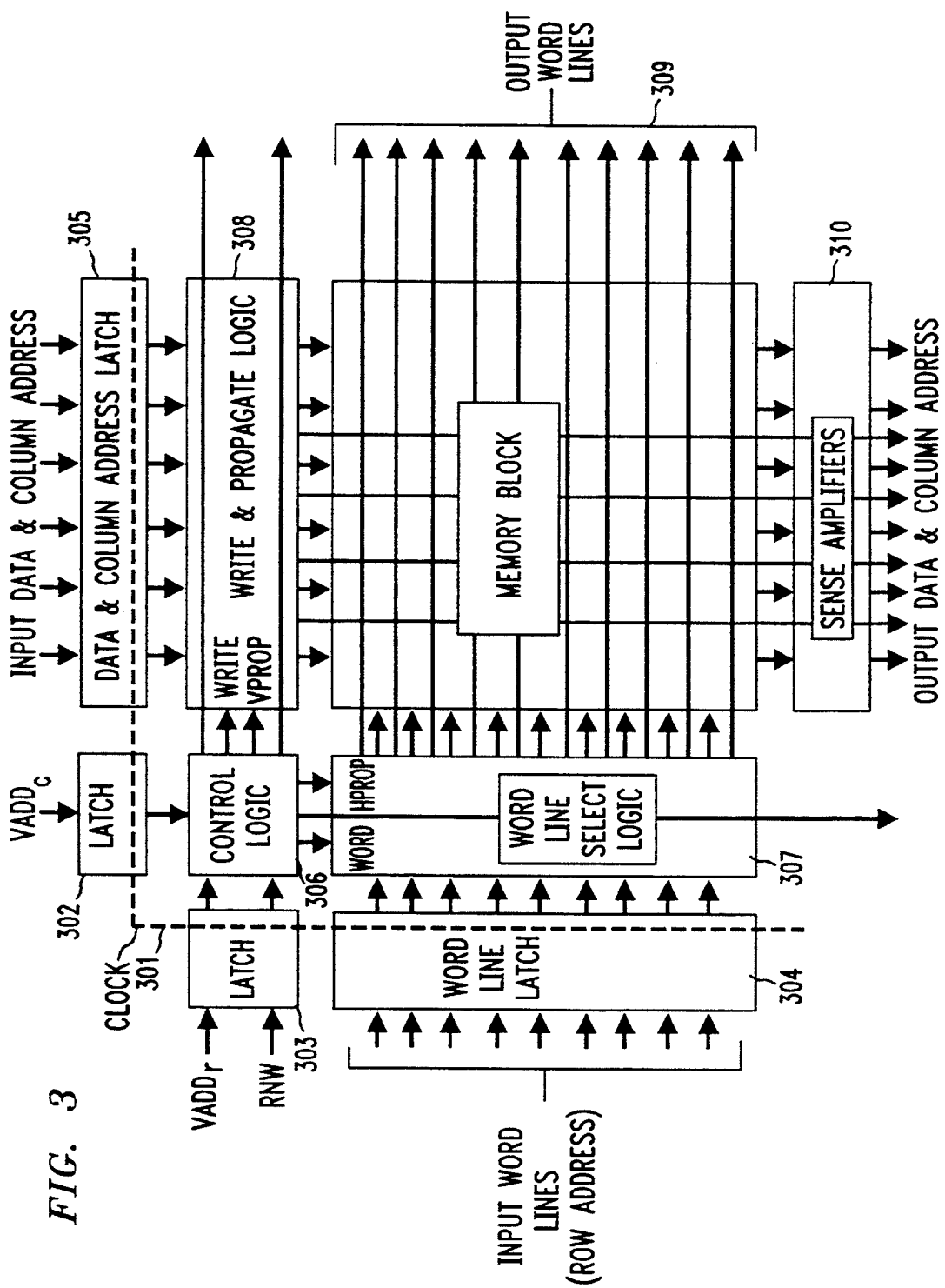
FIG. 3 shows an arrangement of row and column input latches and control signals input within a block of memory shown in FIG. 1 to implement the invention for a Static Random Access Memory (SRAM)

FIG. 3 shows an arrangement of row and column input latches and control signals input within a block to implement the invention for a static random access memory (SRAM).

In FIG. 3, at the upper left hand corner, is shown clock input signal 301. That input signal synchronizes all the latches in the array 309, including latch 302 for valid column address (VADD$_c$), latch 303 for valid row address (VADD$_r$), word line latch 304, and data and column address latch 305. Latches 302, 303, 304 and 305 store the respective a) row and column addresses, b) data or wordline for particular block/cell coordinates. Data and column address latch 305 is a register which stores input data and cell column address. Similarly, word line latch 304 is a multibit register which stores input row addresses. When the row address is fully decoded, the word line latch 304 has, at most, as many bits as there are rows in the memory array. As mentioned above, in some implementations, decoder 101 of FIG. 1 may not perform full decoding. In those cases, further decoding might be required in each block. When the row address is partially decoded, word line latch 304 has a number of bits that is less than the number of rows in the memory array. In that case, further decoding takes place in word line select logic 307. Finally, when the row address is fully encoded, the number of bits stored in word line latch 304 is equal to log$_2$ K, where K is the number of rows in the memory array. In that case, full decoding takes place in word line select logic 307.

Control logic 306 receives input from latches 303 and 302 and generates intrablock control signals that are passed to either word line select logic 307 or to write and propagate logic 308. In addition, control logic 306 also generates interblock control signals that are passed to adjacent blocks within the array. Control signals are commands that are issued by control logic 306 in order to perform specific functions. Those functions include a) writing data to a specific memory cell ("Write" command) b) propagating input addresses and/or data vertically ("VProp" command) or horizontally ("HProp" command). Those commands are initiated using, for example, a truth table. The HProp (horizontal propagation) is true when the valid row address is true and the valid column address is false. A Write control signal is true when a valid row address is true, a valid column address is true and a R$\overline{\text{W}}$ (read—not write) is false. The VProp control signal is true when the valid column address is true and the valid row address is false. Finally, the Word control signal is "true" when both the valid row address and the valid column address are "true".

Latch 303 is a two-bit register which stores in one bit, a control signal indicating whether the row address stored in latch 306 is valid. In the other bit, latch 303 stores a R$\overline{\text{W}}$ (read—not write) control signal. Latch 302 stores only one bit indicative of a valid column address. Similarly, latch 305 stores a control signal indicating whether the column address stored in latch 305 is valid.

Interblock control signals include the valid row address stored in latch 303, unless the valid column address is true. Another interblock control signal is the valid column address stored in latch 302, unless valid row address is true and R$\overline{\text{W}}$ is false. As mentioned above, word line select line 307 can perform partial or full decoding of the input row address. When word is true, the decoded row address is connected to the word line inputs of block 309. When VProp is true, the input row address is propagated to the next block in the array. Write and propagate logic 308 receives input signals from control logic 306 and latch 305. When VProp is true the input data and column address are propagated to sense amplifiers 310 using, for example, a small voltage swing to transfer data from write and propagate logic 308 to sense amplifiers 310 through block 309. By contrast, the column input address is transferred from latch 305 to sense amplifiers 310, using, for example, a full voltage swing. When Write is true, the input data from latch 305 is written into the specific memory cell within block 309, indicated by the cell row and cell column address. Sense amplifiers 310 receive as input a column address from write and propagate logic 308 and transfers that address to the adjacent block in the vertical pipeline. The received column address is used to sense data from block 309.

Figure 4:
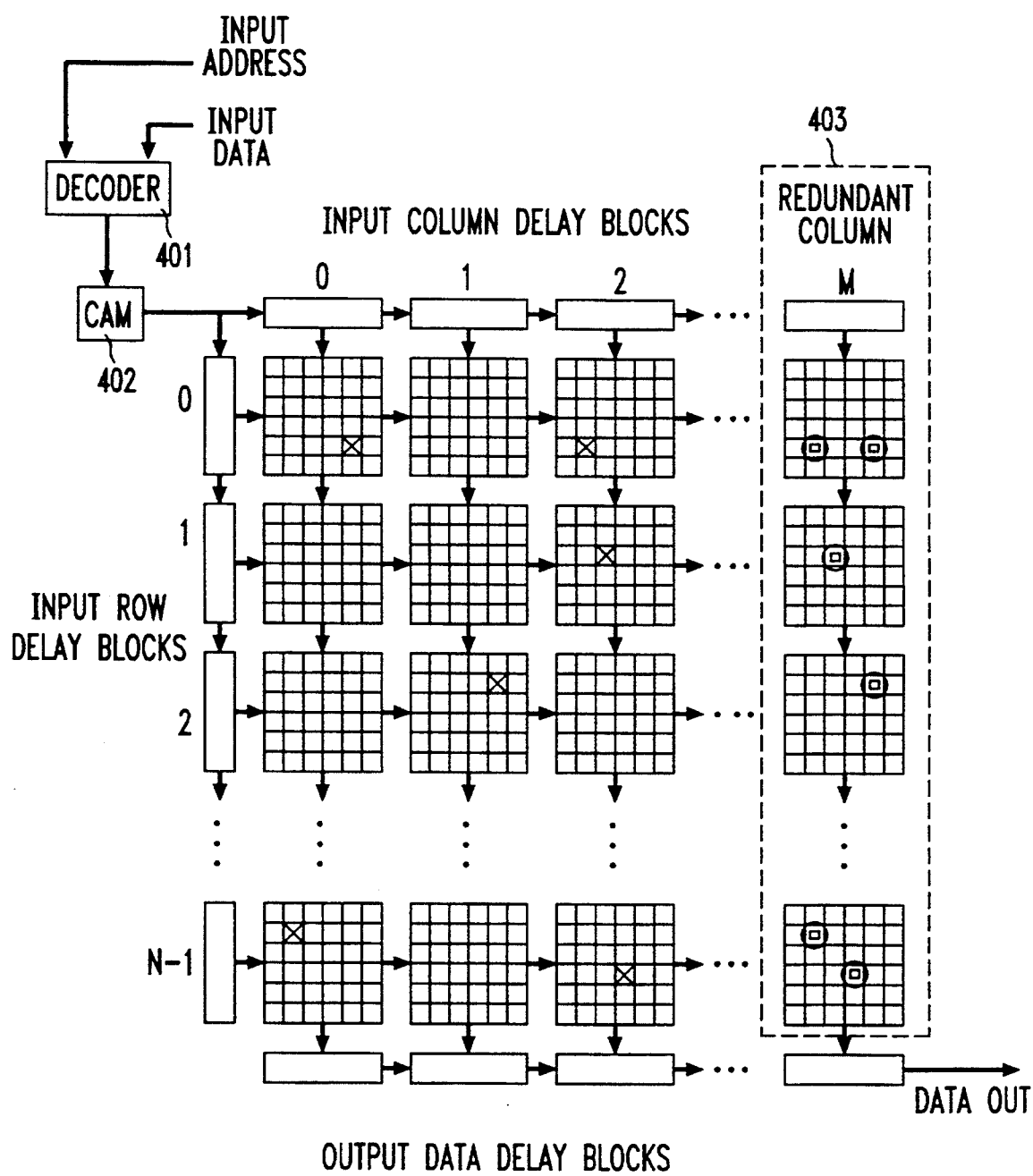
FIG. 4 shows a fault-tolerant array of memory blocks arranged in rows and columns with a redundant column and a content addressable memory (CAM).

FIG. 4 shows a fault-tolerant array of memory blocks arranged in rows and columns with a redundant column and a content addressable memory (CAM). Because the principles of this invention permit the creation of fast and large monolithic memories, fault tolerance must be provided to make those large memories functional and cost effective.

In FIG. 4, defective memory cells are marked with an "X". Associated with each defective memory cell is an operative memory cell which is located in a block of the redundant column of blocks 403, and which is indicated in FIG. 4 by a square in a circle. As indicated in FIG. 4, a defective memory cell has the same cell row and column address as its operative counterpart. A lookup table in CAM 402 correlates the addresses of all defective memory cells in the array to the addresses of corresponding operative cells. While only defective memory cells are shown in FIG. 4, it is to be understood that entire blocks and even entire rows and/or columns can be defective. Accordingly, more than one redundant column (or row) could be represented in the array. Hence, the lookup table in CAM 402 can map a defective block, a column of blocks, a row of blocks to an operative block, column of blocks or row of blocks, respectively.

In FIG. 4, decoder 401 decodes input addresses into row and column addresses that are transmitted to CAM 402. The latter is a specially designed circuit, arranged to compare the input row and column addresses received from decoder 401 to all defective memory cells addresses stored in CAM 402. Addresses of defective memory locations and their corresponding operative locations addresses may be entered into the lookup table of the CAM during the memory manufacturing or self-test process. When the column and row addresses provided by decoder 401 point to a defective memory cell, the block column address of the defective cell is mapped to the block column address of the corresponding operative memory cell. Since the block row addresses and the memory cell addresses (row and column) of defective and operative cells are identical, only the block column address is needed to identify the coordinates of the corresponding operative cell. The memory access mechanism continues as described above, except that it occurs in a different block, albeit in the same row of memory blocks in the array.

The foregoing is only on example of this invention. Persons skilled in the art can easily conceive other examples of this invention, within the scope of the appended claims.

We claim:

1. A memory, comprising:
    an array partitioned into rows and columns of memory blocks, each one of the memory blocks being partitioned into a plurality of rows and columns of memory cells;
    means for decoding addresses of the memory blocks and the memory cells into separate block column, block row, cell column, and cell row address signals;
    means for addressing memory cells within the array using the block and cell address signals; and
    means for pipelining into the blocks of the array a plurality of memory access requests in consecutive clock cycles using the decoding and addressing means to provide memory cell access such that the memory operates at a clock speed equal to a single memory block clock speed.

2. The invention of claim 1 wherein the pipelining means include
    means for propagating a) the block column, and cell column address signals through the columns of the array and b) the block row and cell row address signals through the rows of the array, said block and cell address signals being propagated one block per clock cycle to permit simultaneous arrival of the row and column address signals at a desired memory block identified by the block row and block column address signals.

3. The invention of claim 1 wherein address signals and data are propagated through data paths formed by latches, sense amplifiers and logic circuitry associated with the blocks.

4. The invention of claim 1 further comprising
    means for retrieving data from a selected memory cell.

5. The invention of claim 4 wherein said retrieving means includes
    means for recognizing a small voltage swing read by a sense amplifier associated with the block of the selected memory cell.

6. The invention of claim 4 further comprising
    means for sending data retrieved from at least one memory cell through the blocks of the array, one block per cycle, until the retrieved data reaches an output path of the memory such that pipelined memory access requests are processed in a first-in first-out order.

7. The invention of claim 1 further comprising
    a content addressable memory which stores addresses of defective subsections in the memory and maps the addresses of the defective subsections to different addresses of operative subsections in the memory.

8. The invention of claim 1 wherein each block in the array comprises:
    latches which store in addition to data, valid row and column addresses of memory cells within the block;
    control logic circuitry which receives input from the latches and generate control signals to a) propagate received input data and b) write received input data to a particular memory cell; and
    sense amplifiers which receive a column address as input from one of the latches and transfer the address to a vertically adjacent block.

9. The invention of claim 1 further comprising
    means for writing input data to a selected memory cell when input data are propagated with address signals of the selected memory cell.

10. The invention of claim 1 wherein said writing means further includes
    means for applying full voltage swings on a selected bit line of the selected memory cell.

* * * * *